United States Patent
Matsuda

(10) Patent No.: US 7,750,562 B2
(45) Date of Patent: Jul. 6, 2010

(54) ORGANIC LIGHT EMITTING APPARATUS

(75) Inventor: Koichi Matsuda, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 470 days.

(21) Appl. No.: 11/686,669

(22) Filed: Mar. 15, 2007

(65) Prior Publication Data
US 2007/0222383 A1  Sep. 27, 2007

(30) Foreign Application Priority Data
Mar. 27, 2006 (JP) .............................. 2006-084756
Mar. 8, 2007 (JP) .............................. 2007-058182

(51) Int. Cl.
*H01J 1/62* (2006.01)
(52) U.S. Cl. .................. 313/506; 313/500; 313/504; 313/509
(58) Field of Classification Search .......... 313/498–512
See application file for complete search history.

(56) References Cited

U.S. PATENT DOCUMENTS

| 6,300,224 | B1 | 10/2001 | Arima et al. ................. 438/462 |
| 6,388,310 | B1 | 5/2002 | Seto et al. ................... 257/640 |
| 6,897,607 | B2 | 5/2005 | Sugimoto et al. ........... 313/506 |
| 2005/0079380 | A1* | 4/2005 | Iwanaga .................... 428/688 |
| 2005/0242720 | A1* | 11/2005 | Sano et al. .................. 313/506 |
| 2006/0012292 | A1* | 1/2006 | Kitamura et al. ............ 313/504 |
| 2006/0220548 | A1* | 10/2006 | Menda ....................... 313/512 |
| 2007/0159095 | A1 | 7/2007 | Matsuda et al. ............. 313/512 |

FOREIGN PATENT DOCUMENTS

| JP | 8-111286 | 4/1996 |
| JP | 10-74757 | 3/1998 |
| JP | 2001-44141 | 2/2001 |
| JP | 2001-126866 | 5/2001 |
| JP | 2002-100469 | 4/2002 |

\* cited by examiner

*Primary Examiner*—Bumsuk Won
(74) *Attorney, Agent, or Firm*—Fitzpatrick, Cella, Harper & Scinto

(57) ABSTRACT

An organic light emitting apparatus obtained by dividing a plurality of organic light emitting apparatuses that are integrally formed, including a substrate; an organic light emitting device which is placed on the substrate and has a first electrode, an organic compound layer and a second electrode provided on the substrate in this order; and an inorganic moisture barrier layer formed on the organic light emitting device to cover the organic light emitting device. The inorganic moisture barrier layer has, around the organic light emitting device, a division end formed by dividing the inorganic moisture barrier layer, and the division end of the inorganic moisture barrier layer has a thickness smaller than the inorganic moisture barrier layer on the organic light emitting device.

6 Claims, 3 Drawing Sheets

ORGANIC LIGHT EMITTING APPARATUS

BACKGROUND OF THE INVENTION

1. Field of the Invention

The present invention relates to an organic light emitting apparatus for use in, for example, a light emission type display or a surface emitting light source.

2. Description of the Related Art

An inorganic material has been used for an inorganic moisture barrier layer in an organic light emitting device (which may hereinafter be abbreviated as "device") of which the light emitting portion of an organic light emitting apparatus is formed because the inorganic material improves the durability of the device under various use environments, and is excellent in optical properties. The inorganic moisture barrier layer is required to provide a hard, dense film structure so as to cover the entirety of the device because the purpose of the layer is to prevent moisture or oxygen from penetrating into the device.

A conventionally known method of forming a hard, dense film is a film formation method involving the employment of a VHF plasma CVD method. The method has been employed as an approach to forming an inorganic moisture barrier layer without damaging an organic compound layer below the inorganic moisture barrier layer. The inorganic moisture barrier layer produced by this CVD method is formed of an inorganic material, and serves as a single film having high moisture barrier properties. However, the layer is apt to crack owing to an external impact because the layer is hard and dense. The generated crack serves as a defect, with the result that the moisture barrier properties of the layer are impaired in some cases.

In addition, in order to improve the productivity of a device, it is necessary that a large number of devices are integrated on a single substrate so that the tact time is shortened. Accordingly, a step of dividing the substrate on which the inorganic moisture barrier layer is formed may be included. A defect such as a crack in the inorganic moisture barrier layer generated at the time of the dividing step is responsible for a reduction in reliability of a device after the division. In view of the foregoing, various studies have been conducted on a production method for a device, the constitution of the device, etc. in order to prevent such defect.

Japanese Patent Application Laid-Open No. H10-074757 proposes the following method: for an inorganic moisture barrier layer excellent in adhesiveness and moisture resistance, an exposed portion of an SiON layer is subjected to an ammonia plasma treatment for the nitriding of an edge portion of top surface of the layer, whereby moisture is prevented from penetrating from the periphery of the layer.

Japanese Patent Application Laid-Open No. 2001-044141 proposes a method of preventing a crack from expanding toward a device on a GaAs substrate. A groove is formed by etching along a dicing line before the device is cut at its circumferential portion. Then, an insulating film made of SiN or the like is formed on the groove. Even when a crack is generated as a result of the segmentation of the device by dicing, a stress concentration on an R portion present in the groove, whereby the expansion of the crack is prevented.

Japanese Patent Application Laid-Open No. 2001-126866 proposes the following method: an organic EL device is sandwiched between two substrates by using a photocurable resin as an adhesive layer, a resin at a light emitting device portion is initially cured with light, and a cutting portion is divided by pushing without being cured, whereby the generation of a crack at the uncured cutting portion is prevented.

However, the technique disclosed in Japanese Patent Application Laid-Open No. H10-074757 is not preferable in terms of productivity because its purpose is the improvement of a moisture transmitting layer appearing as a result of the removal of the inorganic moisture barrier layer at a scribe line by etching, and it requires an increased number of steps including a step for the nitriding of the exposed portion of the inorganic moisture barrier layer. Therefore, it may be desirable to proceed to a breaking step after scribing without conducting an etching step.

On the other hand, the technique disclosed in Japanese Patent Application Laid-Open No. 2001-044141 is a method of stopping the progress of a crack generated in an inorganic moisture barrier layer by causing a stress to concentrate on a folded point in the inorganic moisture barrier layer. The method, which is applied to a cutting method such as dicing in the given example, is also applicable to scribing. However, the need for forming a groove by etching in a substrate for providing the inside of the inorganic moisture barrier layer with a folded point reduces productivity. In addition, it is difficult to form a groove on, for example, a glass substrate. The inventors of the present invention have paid attention to the circumstance that losses in terms of an improvement in productivity and of reliability may be caused in the case where a cutting surface is treated by using another step so that a structure having high moisture barrier properties is provided, or where a structure that hardly cracks owing to cutting is provided by another step.

Further, the technique disclosed in Japanese Patent Application Laid-Open No. 2001-126866, which does not related to a silicon compound, is a method of preventing defects upon cutting such as chipping and cracking by letting the hardness of the photocurable resin layer on a light emitting layer differ from that on a cutting surface. However, a difference between the hardness of an inorganic moisture barrier layer formed of an inorganic material before curing and that after the curing is smaller than in the case of an organic substance such as a resin, so the prevention of defects cannot be expected.

SUMMARY OF THE INVENTION

According to the present invention, there is provided an organic light emitting apparatus excellent in productivity while maintaining moisture barrier properties and optical performance.

In order to solve the problems of the mentioned-above background art, according to the present invention, there is provided an organic light emitting apparatus obtained by dividing plural organic light emitting apparatuses that are integrally formed. The organic light emitting apparatus includes a substrate; an organic light emitting device which is placed on the substrate and has a first electrode, an organic compound layer and a second electrode provided on the substrate in this order; and an inorganic moisture barrier layer formed on the organic light emitting device to cover the organic light emitting device, in which: the inorganic moisture barrier layer has, around the organic light emitting device, a division end formed by dividing the inorganic moisture barrier layer; and the division end of the inorganic moisture barrier layer has a thickness smaller than the inorganic moisture barrier layer on the organic light emitting device.

The organic light emitting apparatus according to the present invention is excellent in moisture barrier properties and optical property because of the following reason: upon acquisition of the apparatus by dividing plural organic light emitting apparatuses on a single substrate, the apparatus does not cause the deterioration of the properties of a device due to the generation of a defect such as a crack resulting from the division. Moreover, the apparatus is excellent in productivity.

Further features of the present invention will become apparent from the following description of exemplary embodiments with reference to the attached drawings.

DESCRIPTION OF THE EMBODIMENTS

Hereinafter, the present invention will be described in detail with reference to the drawings. However, an organic light emitting apparatus of the present invention is not limited by the following description.

Figure 1:
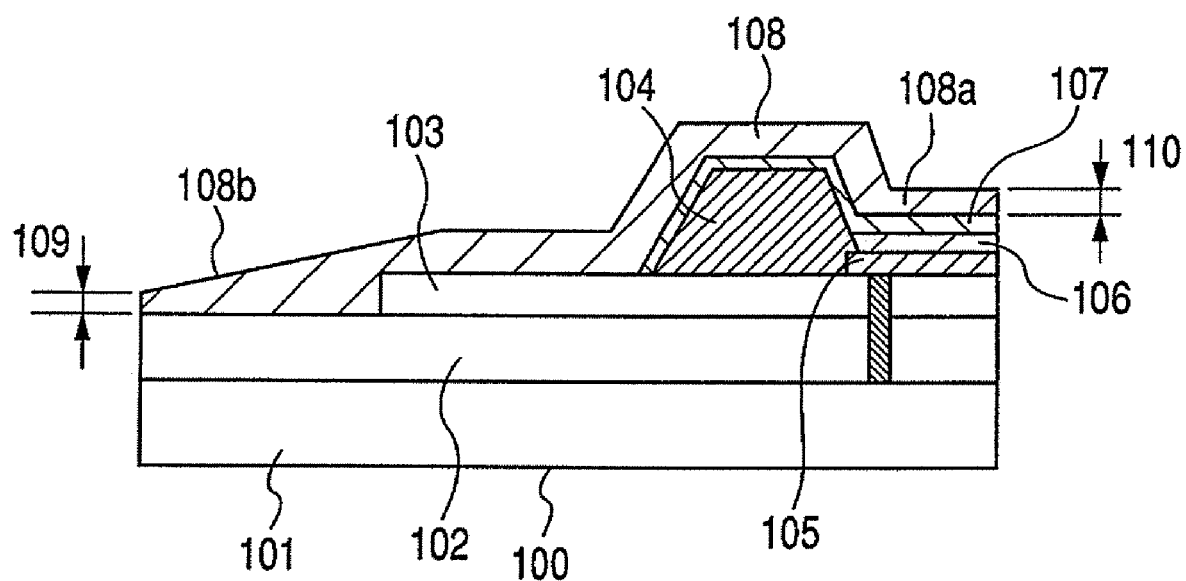
FIG. 1 is a schematic sectional view showing an organic light emitting apparatus of the present invention.

FIG. 1 is a schematic sectional view showing the basic constitution of an organic light emitting apparatus 100 according to the present invention around an apparatus end.

Lower layers including an insulating layer 102, a drive circuit (not shown), an organic smoothed layer 103, and a first electrode 105 are formed on a glass substrate 101. An organic compound layer (organic EL layer) 106 and a second electrode layer 107 are formed on the first electrode 105. The organic compound layer 106 includes a light emitting layer that emits light by recombination between a hole supplied from the first electrode 105 and an electron supplied from the second electrode 107. The organic compound layer 106 further includes a hole transport layer (not shown) and an electron injection layer (not shown). Then, a portion which is formed of the first electrode 105, the organic compound layer 106, and the second electrode 107 and which emits light serves as an organic light emitting device. A light emitting region is formed by placing one or plural organic light emitting devices on the glass substrate 101. When plural organic light emitting devices are placed, an image, a letter, and the like can be displayed. The organic light emitting device is covered with an inorganic moisture barrier layer 108. Light emitted from the light emitting layer transmits through the organic compound layer 106, the second electrode 107, and the inorganic moisture barrier layer 108 so as to be extracted to the outside of the device. In other words, in this case, a so-called top emission type organic light emitting apparatus in which each of the second electrode 107 and the inorganic moisture barrier layer 108 serves as a light transmitting member is obtained.

The inorganic moisture barrier layer 108 which is characteristic of the present invention will be described.

The inorganic moisture barrier layer 108 is favorably an inorganic layer mainly formed of silicon, and is more favorably formed of one of silicon oxide, silicon nitride, and silicon oxynitride. The composition, structure, and thickness of the layer are determined depending on light transmission rate, moisture transmission rate, transmission rate for a gas containing $O_2$, and adhesiveness. The inorganic moisture barrier layer 108 may contain, for example, a hydrogen atom or a fluorine atom as well as nitrogen or oxygen.

The inorganic moisture barrier layer 108 is formed by a Cat-CVD method, a sputtering method, or a plasma CVD method. In the case of the plasma CVD method, an excitation frequency to be used ranges from 13.56 MHz to 100 MHz. The frequency determines the electron temperature and the electron density in plasma; the electron temperature increases and the electron density reduces with reducing frequency. Accordingly, an ion is accelerated in a region having a high electron temperature, so plasma damage to the organic compound layer 106 below the layer 108 cannot be ignored. In addition, a high excitation frequency is disadvantageous for the formation of a large area, uniform film because electric field distribution is apt to occur. Accordingly, a frequency in the range of 20 MHz to 80 MHz is suitably used.

A higher light transmission rate is more advantageous for an improvement in efficiency of the organic light emitting apparatus 100. However, when a light transmission rate is excessively high, a trade-off relationship may be established between moisture barrier properties and optical absorption. In view of this, a light transmission rate of about 20% or less is suitably used at an optical absorption wavelength of 400 nm.

In addition, upon formation of the inorganic moisture barrier layer 108, various foreign materials in a chamber such as the mass of an organic substance due to the splash of evaporation and product particles adhere onto the organic compound layers 106 or the second electrode 107 in some cases. In such cases, the inorganic moisture barrier layer 108 cannot be sufficiently formed near the foreign materials. As a result, a path through which moisture or a gas component can pass is formed, so sufficient moisture barrier properties cannot be secured in some cases. In such cases, a cover layer having a sufficient thickness is deposited directly above the foreign materials, and an outermost layer having a gentle slope is formed. A layer excellent in moisture barrier properties is deposited on the outermost layer. The inorganic moisture barrier layer 108 thus deposited can completely shield moisture and the like, though the layer still includes the foreign materials in itself. It should be noted that the inorganic moisture barrier layer 108 needs to have some thickness irrespective of whether the layer is of a structure formed of plural layers or a structure formed of a single layer.

A plurality of organic light emitting apparatuses 100 each having such constitution are typically formed on the same substrate 101. After the formation of the inorganic moisture barrier layer 108 which is the final stage of a vacuum process, the organic light emitting apparatus 100es are separated from each other. Examples of a method for separation include a method involving scribing the inorganic moisture barrier layer and breaking the layer along a scribe line and a method involving collectively cutting the inorganic moisture barrier layer and the substrate by dicing. At this time, the division end of the inorganic moisture barrier layer and the division end of the substrate are identical to each other.

The inorganic moisture barrier layer 108 needs to cover a region larger than the entire surface of the organic light emitting apparatus 100. In addition, regarding the area outside the light emitting region of the organic light emitting apparatus 100 except the circuit portion needs to be as narrow as possible. Accordingly, the space between an organic light emitting apparatus and another organic light emitting apparatus is extremely narrow.

Accordingly, when a thickness 110 of an inorganic moisture barrier layer 108a on an organic light emitting device (on the organic compound layers 106 in FIG. 1) and a thickness 109 of an inorganic moisture barrier layer 108b at a division portion (to be divided) around the organic light emitting device are equal to each other, the inorganic moisture barrier layer 108 is apt to crack at the time of division. Specifically, a division surface generated on the substrate 101, that is, a crack generated from, for example, the point of an indenter causes a crack in the substrate 101. The crack reaches the inorganic moisture barrier layer 108. As a result, a crack or peeling occurs in the inorganic moisture barrier layer 108 which is brittle, so the function of the inorganic moisture barrier layer 108 may be impaired. When a crack is generated in the inorganic moisture barrier layer 108, moisture and the like easily penetrate into the device through the organic smoothed layer 103, and affect the organic compound layers 106, thereby deteriorating properties.

It has been found that a crack does not expand when, in contrast to the foregoing, the thickness 109 of the inorganic moisture barrier layer 108b at the division portion (to be divided) is smaller than the thickness 110 of the inorganic moisture barrier layer 108a on the organic light emitting device. This can be inferred from a relationship between the moisture barrier properties and brittleness of the organic light emitting device portion. That is, various surface properties are assumed for the inorganic moisture barrier layer 108a on the organic light emitting device, and the composition and thickness of the layer are determined in consideration of sufficient covering performance and sufficient optical performance. On the other hand, it is conceivable that there is a favorable range for the thickness of the inorganic moisture barrier layer 108a, and the brittleness of the inorganic moisture barrier layer 108a, that is, the easiness with which a crack is generated owing to tensile stress changes in the range. In the case where sufficient moisture barrier properties can be obtained even when the thickness of the layer is small, that is, the case where the moisture barrier capacity per thickness is high, the brittleness is high, and so a crack is apt to be generated. In the case where sufficient moisture barrier properties cannot be obtained unless the thickness of the layer is increased, that is, the case where the moisture barrier capacity per thickness is relatively low, the film property is such that the brittleness is low and a crack is hardly generated. It has been also found that, when division is performed in a state where the thickness 109 of the inorganic moisture barrier layer 108b at the division portion (to be divided) is equal to the thickness 110 of the inorganic moisture barrier layer 108a on the organic compound layers 106, a crack is apt to be generated, and may reach the organic compound layers 106 to be responsible for a reduction in light emitting performance.

It should be noted that the term "thickness of an inorganic moisture barrier layer on an organic light emitting device" as used in the present invention refers to the average thickness of the inorganic moisture barrier layer on the organic light emitting device. The thickness of the inorganic moisture barrier layer is measured at multiple sites such as five sites or ten sites, and the average value of the measured values is defined as the thickness of the inorganic moisture barrier layer. On the other hand, the term "thickness of an inorganic moisture barrier layer at a division portion (to be divided)" refers to the average thickness of a side of the inorganic moisture barrier layer formed at the division portion (to be divided). The thickness of a division end of the inorganic moisture barrier layer is measured at multiple sites such as five sites or ten sites, and the average value of the measured values is defined as the thickness of the inorganic moisture barrier layer.

The range of the thickness 110 of the inorganic moisture barrier layer 108a on the organic light emitting device is specified to some extent from the viewpoints of productivity, optical property, and a stress. As described above, a reduction in light emitting performance of the organic light emitting apparatus 100 can be prevented when the thickness 109 of the inorganic moisture barrier layer 108b at the division portion (to be divided) is smaller than the thickness 110 of the inorganic moisture barrier layer 108a on the organic light emitting device.

The thickness 109 of the inorganic moisture barrier layer 108b at the division portion (to be divided) is desirably 0.7 µm or more to 10 µm or less. In addition, the thickness of each of the four corners of the organic light emitting apparatus 100 near which two divisions are performed is particularly desirably smaller than the thickness of a straight line portion of each of the four sides of the inorganic moisture barrier layer. The term "thickness of a straight line portion of each of the four sides of the inorganic moisture barrier layer" refers to the average thickness of the above-mentioned side of the inorganic moisture barrier layer formed at the division portion (to be divided).

Further, a potential cause for a change in brittleness of the inorganic moisture barrier layer 108 is the composition of silicon, nitrogen, and hydrogen. The content of hydrogen has a particularly large influence on the brittleness change, and an example of the desirable range of the content is 10 atomic % or more to 30 atomic % or less.

With regard to an electrode, the first electrode 105 serving as an anode desirably has a large work function, and examples of a material that can be used in the electrode include gold (Au), platinum (Pt), chromium (Cr), palladium (Pd), selenium (Se), iridium (Ir), copper iodide, and an alloy of any one of these metals.

A magnetron sputtering apparatus is suitably used upon formation of the second electrode 107 as a cathode. Specifically, a transparent conductive film is formed on the substrate 101 by a multiple simultaneous sputtering method (so-called co-sputtering) to conduct simultaneous discharge of a target of ITO or $In_2O_3$ for a transparent conductive film material and a target of $SnO_2$ as a dopant metal which targets are placed in the same film formation space. It should be noted that a multiple simultaneous deposition method involving the use of an electron gun, a multiple simultaneous deposition method based on resistance heating, or a multiple simultaneous ion plating method involving the use of a plasma gun as well as a magnetron sputtering method can be adopted as a method of forming the second electrode 107.

Any thin film formation method may be employed for forming the hole transport layer, the light emitting layer, and the electron injection layer. Examples of a method that can be employed include a deposition method, a sputtering method, a CVD method, a molecular beam epitaxy method (MBE method), a dipping method, a spin coating method, a casting method, a bar coating method, and a roll coating method. A deposition apparatus employing resistance heating is suitably used. In addition, for the case of the electron injection layer, a co-deposition method involving simultaneously heating and depositing a doping material and an organic compound is suitably employed.

A top emission type organic light emitting apparatus has been described in the foregoing embodiment. However, the organic light emitting apparatus of the present invention is not limited to a top emission type organic light emitting apparatus, and may be a bottom emission type organic light emitting apparatus in which light emitted from a light emitting layer transmits through a substrate so as to be extracted.

In addition, the organic light emitting apparatus of the present invention may be an apparatus having one organic light emitting device, or may be an apparatus having plural organic light emitting devices. An organic light emitting apparatus having one organic light emitting device can be favorably used in a backlight for illumination, a liquid crystal display apparatus, or the like. In addition, an organic light emitting apparatus having plural organic light emitting devices corresponding to three colors, that is, red, green, and blue colors can be favorably used as a full-color organic EL display apparatus. The organic light emitting apparatus of the present invention can be favorably used as an organic EL display apparatus in, for example, a television, a PC monitor, the display portion of a mobile phone, or the back display portion of a camera.

Hereinafter, the examples of the organic light emitting apparatus of the present invention will be described. However, the contents of the present invention are not limited by the following examples.

Example 1

Evaluation for moisture barrier properties was performed by using a substrate obtained by depositing metal calcium onto glass. A glass substrate was conveyed into a deposition apparatus capable of taking the glass substrate into and out of a CVD chamber for forming an inorganic moisture barrier layer, while maintaining a vacuum. Then, calcium as a deposition source was deposited to have a predetermined thickness. An inorganic moisture barrier layer having a thickness shown in Table 1 was deposited onto the glass substrate, whereby a sample structured so that a calcium layer would not be in direct contact with the external air was formed.

The calcium layer was postulated for an organic compound layer.

In addition, the inorganic moisture barrier layer was formed of silicon nitride containing hydrogen, and was produced by employing a plasma CVD method involving the use of a silane gas, a nitrogen gas, and a hydrogen gas as raw material gases under a predetermined pressure at an input power of 60 MHz.

The sample was provided in advance with a division region at a division portion (to be divided) in the case where the calcium layer was regarded as a device.

In addition, in order that the thickness of the inorganic moisture barrier layer at the division portion (to be divided) can be adjusted, the thickness of the inorganic moisture barrier layer on an organic light emitting device and the thickness of the inorganic moisture barrier layer at the division portion (to be divided) shown in Table 1 were formed by adjusting, for example, the size of a mask at the time of deposition, the distance of the mask from the glass substrate, and the thickness of the mask.

The division portion (to be divided) of the sample thus produced was subjected to division operation by using a cutter having a wheel diameter of 4 mm and an indenter point angle of 120°.

Those samples were left standing under atmospheric conditions of 60° C. and 90% RH for 250 hours, and each sample was evaluated for its light transmission rate when calcium reacted with the external air through the inorganic moisture barrier layer to change into calcium hydroxide. Each sample was evaluated at the outermost region of the calcium layer. In addition, the light absorption rate of the calcium layer in a state where the layer did not react with the external air was nearly 100%.

The numerical value represents the extent to which the external air penetrates into the inorganic moisture barrier layer from the outer periphery of the layer.

TABLE 1

| Sample No. | The thickness of an inorganic moisture barrier layer on an organic compound layer (μm) | The thickness of an inorganic moisture barrier layer at a division portion (to be divided) (μm) | Ca layer absorption rate (relative value) |
|---|---|---|---|
| Comparative example 1-1 | 0.1 | 0.1 | 0.15 |
| Example 1-1 | 0.2 | 0.1 | 0.50 |
| Example 1-2 | 0.7 | 0.5 | 0.70 |
| Example 1-3 | 1.0 | 0.7 | 0.98 |
| Example 1-4 | 1.5 | 1.0 | 0.99 |
| Example 1-5 | 5.0 | 3.0 | 0.96 |
| Comparative example 1-2 | 5.0 | 5.0 | 0.88 |
| Comparative example 1-3 | 10.0 | 10.0 | 0.85 |
| Example 1-6 | 11.0 | 10.0 | 1.00 |
| Example 1-7 | 15.0 | 11.0 | 0.96 |

[Evaluation of Device]

As shown in Table 1, a thickness of the inorganic moisture barrier layer at the division portion (to be divided) of 0.7 μm or more was found to have a high preventing effect on the penetration of moisture from the outer periphery of the layer. Further, when the thickness of the inorganic moisture barrier layer on the organic light emitting device and the thickness of the inorganic moisture barrier layer at the division portion (to be divided) were equal to each other, the division portion after division was observed. As a result, the following was found: a crack extended toward the center of the layer, and caused calcium to react. It was found that the maintenance of moisture barrier properties was attained when the thickness of the inorganic moisture barrier layer at the division portion (to be divided) was smaller than the thickness of the inorganic moisture barrier layer on the organic light emitting device as described above.

Example 2

Figure 2:
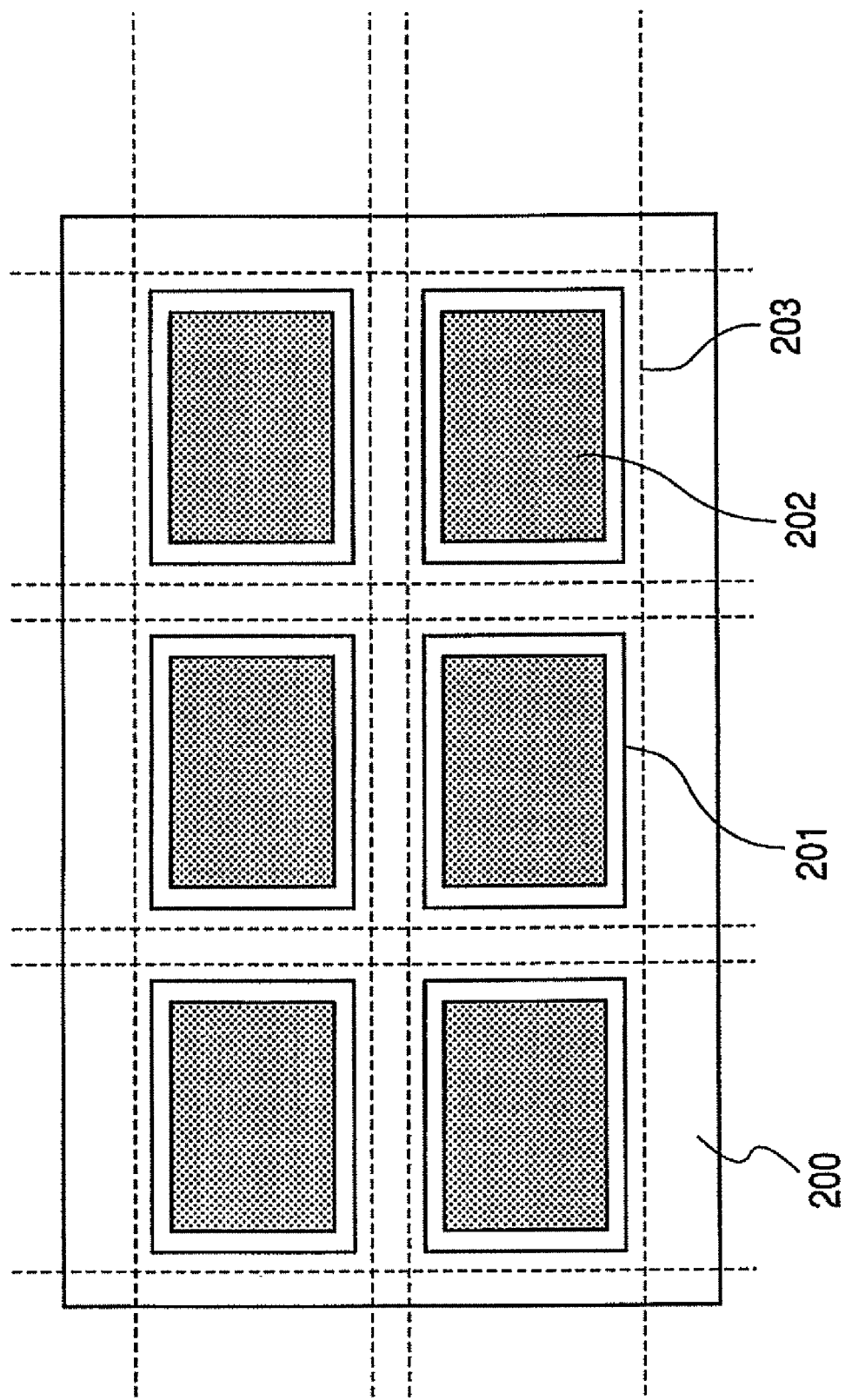
FIG. 2 is an outline view showing the entire surface of the organic light emitting apparatus of the present invention before cutting.
Figure 3:
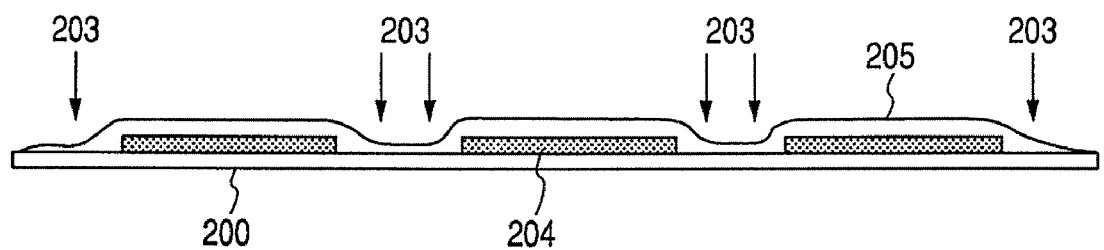
FIG. 3 is a schematic sectional view showing the organic light emitting apparatus of the present invention before cutting.

FIG. 2 is an outline plan view showing an organic light emitting apparatus of this example. In the figure, reference numeral 200 represents a glass substrate, reference numeral 201 represents a circumferential circuit region, and reference numeral 202 represents a light emitting region. Lines (broken lines) 203 running in longitudinal and transverse directions represent cutting portions. FIG. 3 is the outline sectional view of FIG. 2. In the figure, reference numeral 204 represents an organic light emitting device portion, and reference numeral 205 represents an inorganic moisture barrier layer. It should be noted that the organic light emitting device portion is a portion formed of plural organic light emitting devices. The outline of the portion is shown in each of FIGS. 2 and 3.

The organic light emitting device portion 204 was formed by the following method on the glass substrate 200 having a thickness of 1.0 mm and provided with six TFT devices and with wiring for the matrix driving of the devices.

In each organic light emitting device, Al is deposited to serve as a metal electrode on a cathode side. Adjacent organic light emitting devices are isolated from each other by a separating film.

Alq3 was formed into a light emitting layer having a thickness of 40 nm on the above metal electrode by a vacuum deposition method under conditions of a degree of vacuum of $2.7 \times 10^{-3}$ Pa.

Next, αNPD was formed into a hole transport layer having a thickness of 60 nm on the above light emitting layer by a vacuum deposition method under conditions of a degree of vacuum of $2.7 \times 10^{-3}$ Pa.

Further, an ITO film having a thickness of 70 nm was formed as a transparent electrode on an anode side by a sputtering method.

Next, the inorganic moisture barrier layer 205 was formed by a plasma CVD method.

As in the case of Example 1, the inorganic moisture barrier layer was formed of silicon nitride containing hydrogen obtained by employing a plasma CVD method involving the use of a silane gas, a nitrogen gas, and a hydrogen gas at an input power of 60 MHz.

For the purpose of exposure of an external extraction electrode, confinement of an organic smoothed film by the inorganic moisture barrier layer 205 and so on, a mask subjected to pattern formation is used in the formation of the inorganic moisture barrier layer 205 on the glass substrate 200 on which an organic light emitting device including an electrode is formed. In this example, a mask shown in FIG. 4 was used for providing various patterns for the thickness of the inorganic moisture barrier layer on an organic light emitting device (each organic light emitting device portion 204) and the thickness of the inorganic moisture barrier layer at a division portion (to be divided). A mask main body 401 was provided with openings 402, and metallic blocks 403 each having a certain thickness were placed at beam portions for reinforcement and plasma adjustment. The thickness of the inorganic moisture barrier layer was made adjustable by adjusting the thickness and size of each of the portions of intersection of the blocks 403. The thickness of the inorganic moisture barrier layer at these portions was shown in Table 2 as the thickness of the inorganic moisture barrier layer at a portion of intersection.

An integrated organic light emitting apparatus on the glass substrate 200 having the thickness of the inorganic moisture barrier layer on the organic light emitting device portion 204 and the thickness of the inorganic moisture barrier layer at the division portion (to be divided) shown in Table 2 is produced. Each device cut out of the apparatus was evaluated for its "initial properties" and "properties after duration" after standing under atmospheric conditions of 60° C. and 90% RH for 500 hours. Table 2 shows the results.

TABLE 2

| Sample No. | The thickness of an inorganic moisture barrier layer on an organic compound layer (μm) | The thickness of an inorganic moisture barrier layer at a division portion (to be divided) (μm) | The thickness of an inorganic moisture barrier layer at a portion of intersection (μm) | The initial efficiency of a device (relative value) | Efficiency after duration (relative value) |
|---|---|---|---|---|---|
| Comparative example 2-1 | 0.1 | 0.1 | 0.09 | 0.12 | 0.10 |
| Example 2-1 | 0.2 | 0.1 | 0.1 | 0.50 | 0.52 |
| Example 2-2 | 0.7 | 0.5 | 0.5 | 0.75 | 0.68 |
| Example 2-3 | 1.0 | 0.8 | 0.8 | 0.89 | 0.90 |
| Example 2-4 | 1.0 | 0.8 | 0.7 | 0.99 | 0.98 |
| Example 2-5 | 1.5 | 1.0 | 0.9 | 0.98 | 0.97 |
| Example 2-6 | 5.0 | 3.0 | 2.8 | 0.95 | 0.95 |
| Comparative example 2-2 | 5.0 | 5.0 | 2.8 | 0.88 | 0.66 |
| Comparative example 2-3 | 10.0 | 10.0 | 8.0 | 0.89 | 0.65 |
| Example 2-7 | 11.0 | 10.0 | 8.0 | 1.00 | 1.00 |
| Example 2-8 | 15.0 | 11.0 | 9.0 | 0.78 | 0.78 |

[Evaluation of Device]

A standing durability test was performed under atmospheric conditions of 60° C. and 90% RH for 500 hours. As a result, it was found that when the thickness of the inorganic moisture barrier layer at the division portion (to be divided) 203 was 0.7 μm or more, nearly no deterioration of properties was observed as shown in Table 2 because such thickness was able to prevent the penetration of moisture from the outer periphery of the layer. Further, it was found that no crack was generated in the inorganic moisture barrier layer, and the maintenance of moisture barrier properties over a long time period was attained when the thickness of the inorganic moisture barrier layer at the division portion (to be divided) 203 was smaller than the thickness of the inorganic moisture barrier layer on the organic light emitting device portion 204. Further, it was found that the generation of a crack was suppressed, and the maintenance of the moisture barrier properties over a long time period was attained when the thickness of the inorganic moisture barrier layer at each apex of its four corners where the probability that a crack was generated at the time of division was highest, or at the portion of intersection, was smaller than the thickness of the inorganic moisture barrier layer at a division portion (to be divided). On the other hand, it was found that when the thickness of the inorganic moisture barrier layer at a division portion (to be divided) exceeded 10 μm, peeling-off that seemed to result from an increase in stress as well as the moisture barrier properties affected the initial properties.

Example 3

Figure 5:
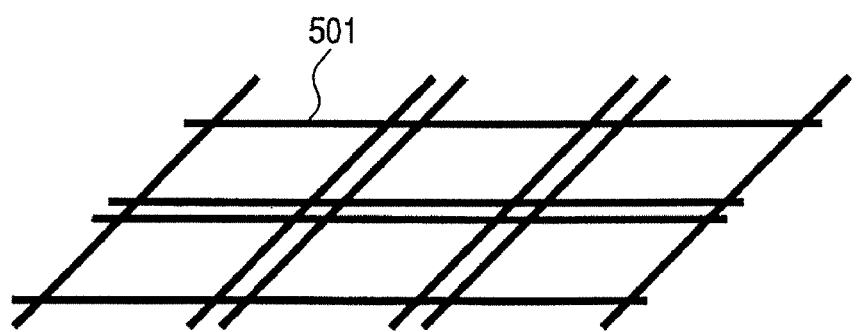
FIG. 5 is a view showing an example of the mask for use in the formation of the inorganic moisture barrier layer.

An organic light emitting apparatus was produced on a glass substrate having a thickness of 1.0 mm and provided with six TFT devices and with wiring for the matrix driving of the devices in exactly the same manner as in Example 2 except that a wire type mask 501 for an inorganic moisture barrier layer shown in FIG. 5 was used.

The organic light emitting apparatus having an inorganic moisture barrier layer thus produced had such a sectional structure as shown in the schematic view of FIG. 3 as in the case of Example 2. In this example, nitrous oxide was newly used as an O-atom supply source. The subsequent analysis of the inorganic moisture barrier layer for its constituent element found that the layer was formed of silicon oxide.

An integrated organic light emitting apparatus on a large substrate having the thickness of the inorganic moisture barrier layer on an organic light emitting device and the thickness of the inorganic moisture barrier layer at a division portion (to be divided) shown in Table 3 is produced in the same manner as in Example 2. Each organic light emitting apparatus cut out of the integrated organic light emitting apparatus was evaluated for its "initial properties" and "properties after duration" after standing under atmospheric conditions of 60° C. and 90% RH for 500 hours. Table 3 shows the results.

TABLE 3

| Sample No. | The thickness of an inorganic moisture barrier layer on an organic compound layer (μm) | The thickness of an inorganic moisture barrier layer at a division portion (to be divided) (μm) | The thickness of an inorganic moisture barrier layer at a portion of intersection (μm) | The initial efficiency of a device (relative value) | Efficiency after duration (relative value) |
|---|---|---|---|---|---|
| Example 3-1 | 0.2 | 0.1 | 0.08 | 0.11 | 0.25 |
| Example 3-2 | 0.3 | 0.1 | 0.09 | 0.55 | 0.50 |
| Example 3-3 | 0.7 | 0.6 | 0.5 | 0.80 | 0.75 |
| Example 3-4 | 1.2 | 0.7 | 0.7 | 0.90 | 0.87 |
| Example 3-5 | 1.2 | 0.8 | 0.7 | 1.00 | 0.99 |
| Example 3-6 | 1.6 | 1.0 | 0.8 | 0.98 | 0.98 |
| Example 3-7 | 5.5 | 3.0 | 2.7 | 0.96 | 0.97 |
| Comparative example 3-1 | 5.5 | 5.5 | 2.7 | 0.89 | 0.68 |
| Comparative example 3-2 | 10.0 | 10.0 | 7.5 | 0.88 | 0.62 |
| Example 3-8 | 12.0 | 10.0 | 7.5 | 1.00 | 1.00 |
| Example 3-9 | 13.0 | 12.0 | 8.8 | 0.77 | 0.78 |

[Evaluation of Device]

A standing durability test was performed under atmospheric conditions including 60° C. and 90% RH for 500 hours. As a result, it was found that when the thickness of the inorganic moisture barrier layer at the division portion (to be divided) was 0.7 μm or more, nearly no deterioration of properties was observed as shown in Table 3 because such thickness was able to prevent the penetration of moisture from the outer periphery of the layer. Further, it was found that no crack was generated in the inorganic moisture barrier layer, and the maintenance of moisture barrier properties over a long time period was attained when the thickness of the inorganic moisture barrier layer at the cutting portion (to be divided) was smaller than the thickness of the inorganic moisture barrier layer on the organic light emitting device. Further, it was found that the generation of a crack was suppressed, and the maintenance of the moisture barrier properties over a long time period was attained when the thickness of the inorganic moisture barrier layer at each apex of its four corners where the probability that a crack was generated at the time of division was highest, or at the portion of intersection, was smaller than the thickness of the inorganic moisture barrier layer at a division portion (to be divided). On the other hand, it was found that when the thickness of the inorganic moisture barrier layer at a division portion (to be divided) exceeded 10 μm, peeling-off that seemed to result from an increase in stress as well as the moisture barrier properties affected the initial properties.

Example 4

Figure 4:
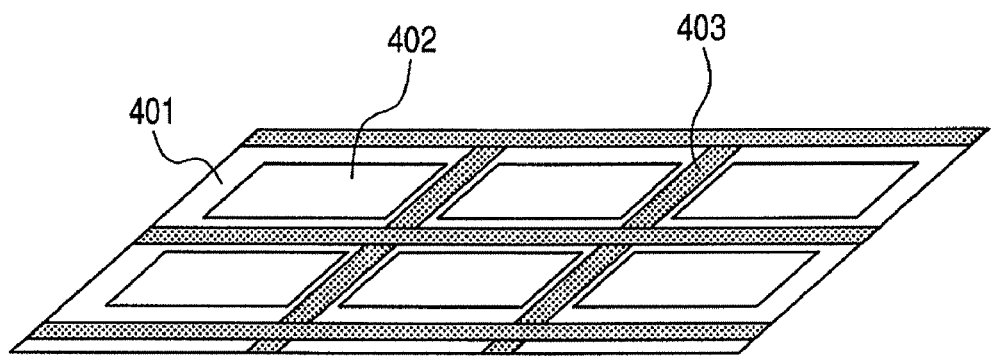
FIG. 4 is a view showing an example of a mask for use in the formation of an inorganic moisture barrier layer.

An organic light emitting apparatus was produced on a glass substrate having a thickness of 1.0 mm and provided with six TFT devices and with wiring for the matrix driving of the devices in exactly the same manner as in Example 2 except that a wire type mask 401 for an inorganic moisture barrier layer shown in FIG. 4 was used.

The organic light emitting apparatus having an inorganic moisture barrier layer thus produced had such a sectional structure as shown in the schematic view of FIG. 3 as in the case of Example 2. In this example, nitrous oxide was used as an O-atom supply source and ammonia was used as a N-atom supply source. The subsequent analysis of the inorganic moisture barrier layer for its constituent element found that the layer was formed of silicon oxynitride.

An integrated organic light emitting apparatus on a large substrate having the thickness of the inorganic moisture barrier layer on various organic light emitting devices and the thickness of the inorganic moisture barrier layer at a division portion (to be divided) shown in Table 3 is produced in the same manner as in Example 2. Each organic light emitting apparatus cut out of the integrated organic light emitting apparatus was evaluated for its "initial properties" and "properties after duration" after standing under atmospheric conditions including 60° C. and 90% RH for 500 hours. Table 4 shows the results.

TABLE 4

| Sample No. | The thickness of an inorganic moisture barrier layer on an organic compound layer (μm) | The thickness of an inorganic moisture barrier layer at a division portion (to be divided) (μm) | The thickness of an inorganic moisture barrier layer at a portion of intersection (μm) | The initial efficiency of a device (relative value) | Efficiency after duration (relative value) |
|---|---|---|---|---|---|
| Comparative example 4-1 | 0.3 | 0.3 | 0.1 | 0.20 | 0.20 |
| Example 4-1 | 0.6 | 0.3 | 0.1 | 0.50 | 0.52 |
| Example 4-2 | 0.7 | 0.3 | 0.5 | 0.75 | 0.68 |
| Example 4-3 | 0.9 | 0.8 | 0.8 | 0.90 | 0.92 |
| Example 4-4 | 1.2 | 1.0 | 0.7 | 0.98 | 0.97 |
| Example 4-5 | 1.7 | 1.0 | 0.7 | 0.99 | 0.99 |
| Example 4-6 | 4.5 | 3.5 | 2.3 | 0.94 | 0.93 |
| Comparative example 4-2 | 5.5 | 5.5 | 2.5 | 0.80 | 0.65 |
| Comparative example 4-3 | 10.0 | 10.0 | 7.5 | 0.88 | 0.70 |
| Example 4-7 | 11.0 | 10.0 | 7.5 | 1.00 | 1.00 |
| Example 4-8 | 15.0 | 11.0 | 8.0 | 0.80 | 0.79 |

As a result, it was found that when the thickness of the inorganic moisture barrier layer at the division portion (to be divided) was 0.7 μm or more, nearly no deterioration of properties was observed as in the case of Example 2 because such thickness was able to prevent the penetration of moisture from the outer periphery of the layer. Further, it was found that no crack was generated in the inorganic moisture barrier layer, and the maintenance of moisture barrier properties over a long time period was attained when the thickness of the inorganic moisture barrier layer at the division portion (to be divided) was smaller than the thickness of the inorganic moisture barrier layer on the organic light emitting device. Further, it was found that the generation of a crack was suppressed, and the maintenance of the moisture barrier properties over a long time period was attained when the thickness of the inorganic moisture barrier layer at each apex of its four corners where the probability that a crack was generated at the time of division was highest, or at the portion of intersection, was smaller than the thickness of the inorganic moisture barrier layer at the division portion (to be divided). On the other hand, it was found that when the thickness of the inorganic moisture barrier layer at the division portion (to be divided) exceeded 10 μm, peeling-off that seemed to result from an increase in stress as well as the moisture barrier properties affected the initial properties.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-084756, filed Mar. 27, 2006, and Japanese Patent Application No. 2007-058182, filed Mar. 8, 2007, which are hereby incorporated by reference herein in their entirety.

What is claimed is:

1. An organic light emitting apparatus obtained by dividing a plurality of organic light emitting apparatuses that are integrally formed, comprising:
    a substrate;
    an organic light emitting device which is placed on the substrate and has a first electrode, an organic compound layer and a second electrode provided on the substrate in this order; and
    an inorganic moisture barrier layer formed on the organic light emitting device to cover the organic light emitting device,
    wherein the substrate has, around the organic light emitting device, a first division end formed by dividing the substrate,
    wherein the inorganic moisture barrier layer has, around the organic light emitting device, a second division end formed by dividing the inorganic moisture barrier layer,
    wherein the first division end of the substrate and the second division end of the inorganic moisture barrier layer are identical to each other, and
    wherein the second division end of the inorganic moisture barrier layer has a thickness smaller than the inorganic moisture barrier layer on the organic light emitting device.

2. An organic light emitting apparatus according to claim 1, wherein the thickness of the second division end of the inorganic moisture barrier layer is 0.7 μm or more to 10 μm or less.

3. An organic light emitting apparatus according to claim 1, wherein the inorganic moisture barrier layer has the second division end on outer four sides of the inorganic moisture barrier layer, and wherein each apex of four corners of the inorganic moisture barrier layer has a thickness smaller than a straight line portion of the four sides of the inorganic moisture barrier layer.

4. An organic light emitting apparatus according to claim 1, wherein the inorganic moisture barrier layer is formed of one of silicon oxide, silicon nitride, and silicon oxynitride.

5. An organic light emitting apparatus according to claim 1, wherein the inorganic moisture barrier layer contains a hydrogen atom, and wherein the hydrogen atom is contained in an amount of 10 atomic % or more to 30 atomic % or less.

6. An organic light emitting apparatus according to claim 1, which is of a top emission type organic light emitting apparatus, wherein
    each of the second electrode and the inorganic moisture barrier layer is a light transmitting member.

* * * * *